United States Patent [19]

Larguier et al.

[11] Patent Number: 4,743,464

[45] Date of Patent: May 10, 1988

[54] PROCESS FOR MANUFACTURING CAPACITIVE KEYBOARDS AND NEW KEYBOARDS OBTAINED BY THIS PROCESS

[76] Inventors: Jean L. Larguier, Chemin des Canaux, 30 230 Caissargues; Daniel Duchalet, Cayweth, "Au Colombier", 82240 Septfonds, both of France

[21] Appl. No.: 787,882
[22] PCT Filed: Feb. 13, 1985
[86] PCT No.: PCT/FR85/00025
§ 371 Date: Dec. 6, 1985
§ 102(e) Date: Dec. 6, 1985
[87] PCT Pub. No.: WO85/03605
PCT Pub. Date: Aug. 15, 1985

[30] Foreign Application Priority Data

Feb. 13, 1984 [FR] France ................................ 84 02135

[51] Int. Cl.$^4$ ............................................... B05D 5/12
[52] U.S. Cl. ......................................... 427/58; 427/79; 427/96; 340/365 C
[58] Field of Search ...................... 427/58, 79, 96, 98; 340/365 C

[56] References Cited

U.S. PATENT DOCUMENTS 3,951,250 4/1976 Pointon ............................. 440/694
4,391,845 7/1985 Denley ................................. 427/58

Primary Examiner—John H. Newsome
Attorney, Agent, or Firm—Larson and Taylor

[57] ABSTRACT

According to the process, there is applied to one face of a relatively rigid isolating support (1) a first matrix arrangement of areas (3) connected by conductor tracks of lines (4). Said arrangement is coated with a thin layer of isolating lacquer (5) and a second matrix arrangement of areas (6) is set in place on the lacquer layer with their conductor tracks of columns (7) to obtain, by bringing together an armature towards each stud comprised of two areas (3, 6), a capacitive connection.

10 Claims, 1 Drawing Sheet

PROCESS FOR MANUFACTURING CAPACITIVE KEYBOARDS AND NEW KEYBOARDS OBTAINED BY THIS PROCESS

The present invention relates to a process for manufacturing matrix type capacitive keyboards formed of electric circuits providing a plurality of separate controls from key pads forming a keyboard. The invention also relates to keyboards obtained by this process.

Such keyboards comprise a matrix arrangement of conducting studs associated respectively with the keys of the keyboard and disposed in spatial concordance with said keys, each of said studs being formed of two conducting areas insulated electrically from each other and able to be coupled capacitively together by bringing close thereto a conducting armature through actuation of the corresponding key. Such keyboards may be used for controlling apparatus and different machines such as computing machines, typewriters, computers etc..

Generally, the two areas of the same stud are disposed on each side of a foil of insulating material while being generally offset with respect to each other in a direction parallel to the plane of said foil. Thus two matrix arrangements of studs are obtained, namely one on each face of the foil, the areas of one of the arrangements being for example connected together by columns whereas that of the other arrangement are connected together by lines, the foil of insulating material thus allowing crossing of the respective line and column conductors while separating and isolating the lines and the columns.

Thus, in the U.S. Pat. No. 3,921,167, these two matrix arrangements are provided on two different insulating plates, then these two plates are juxtaposed one against the other with their conducting arrangements orientated towards each other but with interpositioning of an insert foil. It will however be understood that in this case the capacitive coupling between the two areas of the same stud is hindered by the presence of the insert insulating foil and by the thickness of that one of the two plates situated on the side of the armature controlled by the key.

This is why, in British patent No. 1 582 640, two matrix arrangements are formed on the two faces of the same insulating foil of the type used for forming printed circuits and which have thicknesses greater than 1mm and permittivities of the order of 2.

In order to solve the problems related to the capacitive coupling through such low value capacities in series, it has already been proposed, in the European patent application No. 83 400 433.5, to form such an insulating foil of material from the group formed of the mono-,di- and tri-fluoroolefins of the ethylene family, having permittivities which may be higher than 10 under a high electric field. These insulating foils may have smaller thicknesses for example of the order of 50 microns.

However in practice, in order to ensure a suitable capacitive coupling because of the low powers available, it is necessary to use insulating foils of very small thicknesses of the order of 10 to 20 microns which have no inherent strength, which leads to serious disadvantages during manufacture and handling. The present invention proposes overcoming these drawbacks and provides a process for manufacturing such capacitive keyboards which allows the problems to be avoided which are related to the use of such foils of very small thicknesses.

Another object of the invention is to provide such a process which allows the thickness of the insulating material to be further reduced and, consequently, the performances due to the capacitive coupling to be increased.

A further object of the invention is to allow such keyboards to be manufactured in very large quantities and at a low cost price.

The invention provides a process for manufacturing capacitive keyboards of the type comprising, on each side of an insulating material of small thickness, two matrix arrangements, one in lines, the other in columns, of areas associated two by two so as to form capacitive studs capable of being subjected to the influence of a key allowing a metal armature to be brought close thereto, characterized by the succession of steps consisting in applying a first matrix arrangement to one face of a relatively rigid insulating support, in applying a thin insulating layer to this face thus provided with this arrangement, then in positioning said second matrix arrangement on said insulating layer.

In a particularly preferred embodiment, a thin layer of an insulating varnish which is left to dry or polymerize is applied to the face of the support, previously provided with the first matrix arrangement, following which the second conducting matrix arrangement is positioned on this layer.

Advantageously, the thickness of this varnish may be less than the thickness of a foil. Thus, by way of example, the thickness may be of a few microns.

The insulating material may be formed advantageously, for example, by a material chosen from the group of mono-, di-, fluoroolefins of the ethylene family such as polyvinyl fluoride, polyvinylidene fluoride and polytrifluorethylene.

The insulating support may be of any type, it being of course understood that a certain strength is required of it. Thus it may for example be a rigid plate of a material used for forming printed circuits. It may also be a foil of an insulating plastic material which, while being flexible, has no tendency to collapse. Preferably, the material forming the support is polyester.

The layer of varnish may be applied for example by projecting or spraying, by coating or by passing it through a bath followed by a hardening step.

The invention also relates to a new keyboard obtained by this process, said keyboard being characterized in that it comprises a relatively rigid support, that is to say having no tendency to collapse, on which is applied a first conducting matrix arrangement such for example as a line arrangement, a thin insulating layer laid over said support and its arrangement and a second arrangement, for example in columns, disposed on the apparent face of said layer.

Other advantages and characteristics of the invention will appear from reading the following description, made by way of non limitative example and referring to the accompanying drawing in which.

Figure 1:
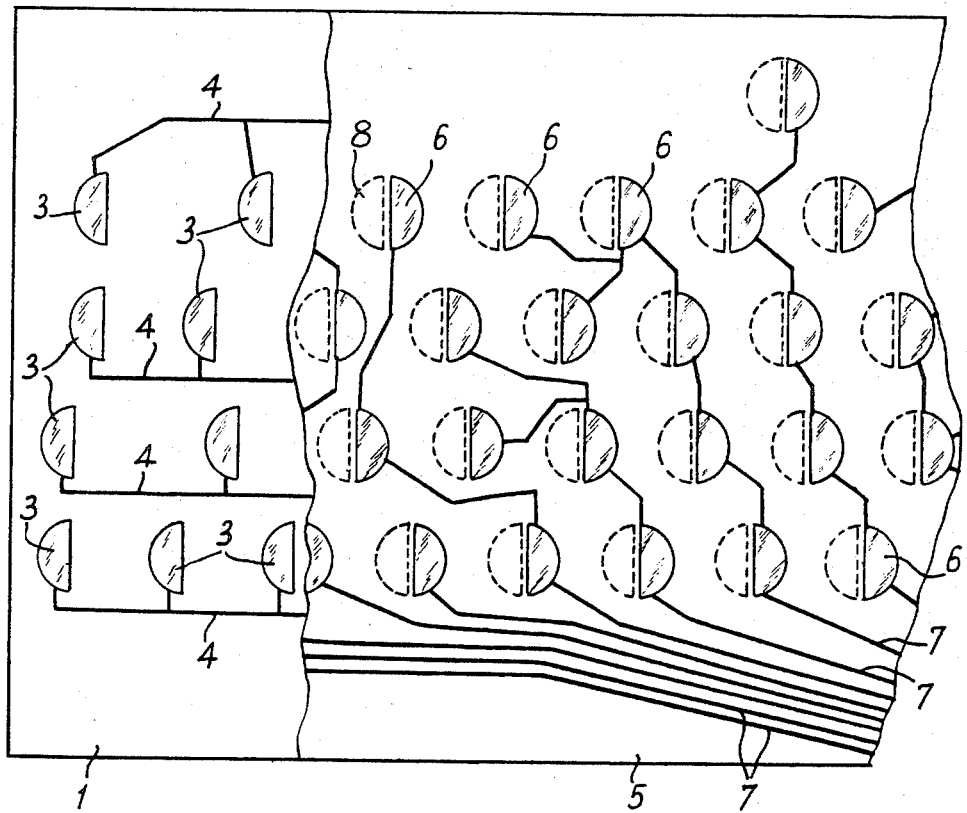
FIG. 1 shows a plane view of a part of a keyboard in accordance with the invention, with a part of the varnish layer omitted.
Figure 2:
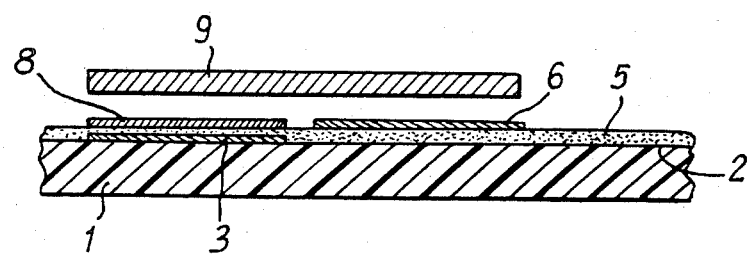
FIG. 2 shows a cross sectional view of the keyboard of the invention with considerable exaggeration of the thickness dimensions.

The process of the invention is put into practice in the following way:

A relatively rigid support is provided formed of a polyester foil having a thickness of 125 microns and dimensions of 150 mm×300 mm.

On the upper face 2 of this foil 1 is formed a matrix arrangement of conducting areas 3, semi circular in shape, connected together by conducting tracks forming a certain number of lines 4. The different areas are disposed in geometrical concordance with the positions of the mechanical keys which will be used on this equipment.

The different lines 4 are connected to a line collecting assembly (not shown) which allows separate electronic communication with each of lines 4, each line 4 serving a plurality of areas 3 attributed to the line on the matrix.

The application of this matrix arrangement may be provided in any known way, by metallization, by the use of a conducting ink, by stenciling, by silk screen printing, etc..

The thickness of areas 3 and of the conducting tracks 4 is of the order of 15 to 30 microns.

Then the whole of the surface of foil 1 carrying the line matrix arrangement which has just been described is coated with a polyurethane varnish.

At the time of application, this varnish has a viscosity of the order of 2000 to 2500 cps. Application is made by silk screen printing at the rate of 15 to 20 g/m$^2$, which leads, after drying (or polymerization) of the varnish, to a solidified layer or film of varnish 5 having a thickness of 15 to 35 microns.

Preferably, the varnish is applied so that the thickness of varnish, above the areas 3, is less than what it is over the rest of foil 1, but this point is not a determining factor. Preferably, the thickness of varnish above area 3 is of the order of 10 to 20 microns.

After solidification or hardening of the varnish, on the upper face of the film of varnish 5 a second matrix arrangement is applied comprising areas 6 connected together by column conducting tracks 7.

It can be seen in the drawings that the projection of one of the two conducting areas, for example 6, of the same stud is situated at the side of the other area, for example 3, and at a small distance therefrom. The column tracks 7 are connected to a column collecting assembly (not shown) which allows separate electric connection with each column.

In FIG. 1 there has been shown with broken lines, disposed opposite areas 3 and facing same, auxiliary areas 8 which may or may not be applied at the same time as area 6 to the film of varnish 5, these areas 8 being preferably completely isolated individually. These areas 8, which are situated exactly above areas 3 of the first matrix arrangement, are simply intended for obtaining a uniform thickness of the assembly under the metal armature 9 which is disposed opposite the stud formed by different areas 3 and 6 so as to avoid the existence of a layer of air as well as asymmetric mechanical deformations when the armature 9 is actuated.

It should be noted that totally isolated auxiliary areas could also be formed on support 1 when areas 3 are positioned; these totally isolated areas would then be disposed opposite areas 6 while being separated from these areas 6 by the film of varnish just as area 3 is separated from area 6.

The operation of the keyboard described is as follows: pressing each key causes the corresponding armature 9 to be lowered and results in capacitively connecting together the two areas 3 and 6 of the corresponding stud, themselves connected by their conductors 4 and 7 respectively to a high frequency electric signal source and to exploitation means.

Although the invention has been described with reference to a particular embodiment, it will be readily understood that it is in no wise limited thereto but that different modifications of form or materials may be made without at all that departing from the scope or spirit of the invention.

We claim:

1. Process for manufacturing capacitive keyboards of the type comprising, on each side of an insulating material of small thickness, two matrix arrangements, one in lines and the other in columns, of areas associated two by two for forming capacitive studs able to be subjected to the influence of a key for causing a metal armature to draw near thereto, characterized by the succession of steps consisting in applying, on one face (2) of a relatively rigid insulating support (1), a first matrix arrangement of areas (3) with their respective conducting tracks (4) in lines (or columns), in applying a thin insulating layer (5) to this face thus provided with this arrangement such that the thickness of said insulating layer on said areas of said first matrix arrangement is less than or equal to 20 microns, then in positioning on said insulating layer (5) said second matrix arrangement of areas (6) with their respectively conducting tracks (7) disposed in columns (or in lines) whereby a capacitive coupling of respective areas of said two matrix arrangements with little hinderance by said insulating layer is provided.

2. Process according to claim 1, characterized in that a layer of hardenable varnish is applied to the face of the support coated with the first matrix arrangement.

3. The process according to claim 2, characterized in that the varnish is applied so as to obtain a thickness of the order of a few microns.

4. Process according to claim 2, characterized in that a varnish is used formed by a material from the group chosen from the mono-, di-, and tri-fluoroolefins of the ethylene family.

5. Process according to claim 1, characterized in that the first matrix arrangement is applied to a support (1) formed by a rigid plate.

6. Process according to claim 1, characterized in that the first matrix arrangement is applied to a support (1) formed from a flexible foil having inherent strength.

7. Process according to claim 1, characterized in that there are provided, at the same time as one/and or other matrix arrangement, auxiliary areas (8) coinciding in projection with that of the areas (3, 6) disposed on the other side of the layer (5) of insulating material.

8. New keyboard obtained by the process according to claim 1, characterized in that it comprises a relatively rigid support (1) on which is applied a first conducting matrix arrangement comprising areas (3) with their conducting tracks (4) disposed in lines (or columns), a thin insulating layer (5) laid over said support and its arrangement and, on the insulating layer, a second arrangement of areas (6) with their conducting tracks (7) disposed in columns (or lines) on the apparent face of said layer (5).

9. New keyboard according to claim 8, characterized in that the insulating layer is formed of a hardened varnish (5).

10. New keyboard according to claim 9, characterized in that the thickness of the insulating layer is of the order of a few microns.

* * * * *